United States Patent
Wang et al.

(10) Patent No.: US 9,019,629 B2
(45) Date of Patent: Apr. 28, 2015

(54) FOUR-LENS MODULE FOR IMAGE CAPTURE

(71) Applicant: Ether Precision, Inc., Grand Cayman (KY)

(72) Inventors: Jianhua Wang, Suzhou (CN); Xiaoxiong Qiu, Suzhou (CN); Jean-Pierre Lusinchi, Suzhou (CN); Wanghu Wu, Suzhou (CN)

(73) Assignee: Ether Precision Inc., Grand Cayman (KY)

( * ) Notice: Subject to any disclaimer, the term of this patent is extended or adjusted under 35 U.S.C. 154(b) by 0 days.

(21) Appl. No.: 14/186,770

(22) Filed: Feb. 21, 2014

(65) Prior Publication Data

US 2014/0232925 A1    Aug. 21, 2014

Related U.S. Application Data

(63) Continuation of application No. PCT/CN2011/078769, filed on Aug. 23, 2011.

(51) Int. Cl.
| | |
|---|---|
| *G02B 3/02* | (2006.01) |
| *G02B 13/18* | (2006.01) |
| *G02B 9/34* | (2006.01) |
| *G02B 27/00* | (2006.01) |

(Continued)

(52) U.S. Cl.
CPC ............. *G02B 9/34* (2013.01); *G02B 27/0025* (2013.01); *G02B 13/004* (2013.01); *H01L 27/14625* (2013.01); *G02B 13/001* (2013.01); *H04N 5/2254* (2013.01)

(58) Field of Classification Search
CPC ..... G02B 13/004; G02B 27/0025; G02B 9/34
USPC ................................. 359/708–718, 745–797
See application file for complete search history.

(56) References Cited

U.S. PATENT DOCUMENTS

| 5,367,405 A | 11/1994 | Sado |
| 7,274,518 B1 | 9/2007 | Tang et al. |

FOREIGN PATENT DOCUMENTS

| CN | 101295067 | 10/2008 |
| CN | 101344632 | 1/2009 |

(Continued)

OTHER PUBLICATIONS

English translation of abstract of JP4479715 (published Mar. 26, 2010).

(Continued)

*Primary Examiner* — Mahidere Sahle
(74) *Attorney, Agent, or Firm* — McClure, Qualey & Rodack, LLP (57) ABSTRACT

An optical module having an object side and an image side; the module comprising, from the object side to the image side: a first positive meniscus lens having a convergence C1, made of a material having a refractive index Nd1 and an Abbe number Vd1, a second negative meniscus lens having a convergence C2 made of a material having a refractive index Nd2 and an Abbe number Vd2, a third positive meniscus lens having a convergence C3, made of a material having a refractive index Nd3 and an Abbe number Vd3, a fourth negative lens having a convergence C4, made of a material having a refractive index Nd4 and an Abbe number Vd4, wherein: $1.1 < C1/C < 1.35$ II $C1/C2$ II$>2$ $0.5 < C1/C3 < 1.1$ $C1/Vd1 << 5.2$ II $C2/Vd2$ II$<7$ II$\mathring{a}(Ci/Vdi)$II$<4$ with i=1 to 4.

15 Claims, 5 Drawing Sheets

(51) Int. Cl.
*G02B 13/00* (2006.01)
*H01L 27/146* (2006.01)
*H04N 5/225* (2006.01)

(56) References Cited

FOREIGN PATENT DOCUMENTS

| CN | 101634740 | 1/2010 |
|---|---|---|
| JP | 7098430 | 4/1995 |
| JP | 11190820 | 7/1999 |
| JP | 2003098428 | 4/2003 |
| JP | 200231753 | 8/2003 |
| JP | 2007108770 | 4/2007 |
| JP | 4479715 | 3/2010 |

OTHER PUBLICATIONS

English translation of abstract of JP2007108770 (published Apr. 26, 2007).
English translation of the abstract of JP2003098428 (published Apr. 3, 2003).
International Search Report for PCT/CN2011/078769 (mailed May 31, 2012).
English translation of the abstract of JP07098430 (published Apr. 11, 1995).
English translation of the abstract of JP 11190820 (published Jul. 13, 1999).

FOUR-LENS MODULE FOR IMAGE CAPTURE

CROSS REFERENCE TO RELATED APPLICATIONS

This application is a continuation of PCT application entitled "Four-Lens Module for Image Capture" having serial number PCT/CN2011/078769, filed on Aug. 23, 2011, which is incorporated by reference in its entity.

DOMAIN OF THE INVENTION

The present invention relates to optical modules such as those used for image capture in mobile phones, and in particular optical modules comprising four lenses.

BACKGROUND OF THE INVENTION

The trend to thinner and thinner mobile phones, as well as to increasing resolutions, leads to lens modules with particular designs; a lens module being constituted by an assembly of one to several lenses and diaphragms into a lens holder. Also, for modules aiming at large volumes markets a particular attention must be laid on the manufacturability, because a production of several tens of thousands of lens modules per day can be envisaged only when the manufacturing yield is close to 100%.

Depending on the customer's specifications, the constraints that have a major influence on the design are:

Effective Focal Length.

The Effective Focal Length determines the overall dimension of the module. The Effective Focal Length will hereafter be referred to as EFL.

Back Focal Length.

The Back Focal Length, or BFL, is the distance between the apex of the lens closest to the sensor, which is the intersection of the optical axis with the surface of the lens closest to the sensor, and the top surface of the sensor.

Convergence.

The Convergence C is the inverse of the EFL. It is also called the power of the lens.

Field of View

Combined with the dimension of the image that will be formed on the focal plane of the module, the EFL determines also the Field of View, referred to as FOV.

When a circular image of diameter D, centered at the intersection of the optical axis with the focal plane is formed in the focal plane of the module, the FOV is defined by the relation:

$$FOV = 2 \cdot \text{Arctan}(D/[2 \cdot EFL])$$

where Arctan is the inverse function of the tangent of an angle.

When the image is rectangular, this diameter D is the dimension of the diagonal of the rectangle. The center of the rectangle is at the intersection of the optical axis with the image plane, and is referred to as the image center.

It is also a common practice for defining the position of a point to use either the image height, which is the distance of this point from the image center, or the angle which subtends the segment between the image center and this point, both expressed as a percentage "x" of the maximum half FOV, and noted x % hFOV.

It is well known in the industry that the larger the FOV, the larger the geometric aberrations, and the more difficult it is to realize a lens with high resolution and low astigmatism.

Aperture Number F#

The Aperture diaphragm of the module which limits the light entering the module, and combined with the EFL determines the Aperture Number of the module, referred to as F#, equal to the ratio of the EFL by the diameter of the Aperture diaphragm.

The aperture diaphragm is usually called Stop, as it functions to limit the light into the module.

The F# has a major influence on four important parameters: the light reaching the sensor, which varies as the inverse of the square of the F#, the Depth of Field (DoF), the Hyperfocal distance (HyF) which is the point of focus where an object from half that distance to infinity gives a neat image on the sensor, and the depth of focus (dof) which is the tolerance on the position of the sensor with respect to the lens module.

Resolution

The resolution is measured by the Modulation Transfer Function (MTF) at a given spatial frequency. The resolution characterizes the contrast between the black area and the white area in an image composed of a series of alternatively black and white stripes of equal width, the width of a pair of stripes being the inverse of the spatial frequency.

The MTF is usually expressed as a percentage of the maximum possible contrast. The maximum MTF is 100%, and the MTF performances of a given lens vary from 0% to 100%.

The spatial frequency is expressed in Line Pair Per Millimeters, abbreviated in 1 ppm.

Aberrations

The aberrations are both geometric and chromatic.

The geometric aberrations include the geometric distortion, the astigmatism, and the EFL differences between various areas of the image. They depend on the curvature on axis of the lenses, and on the asphericity coefficients that define, at a given distance of the axis, the distance between the surface of a sphere having the same radius on axis and the surface of the lens.

The chromatic aberrations include the "colored fringes" (edges of an object are surrounded by parallel edges of various colors) and the "colored area" (a white image presents for example pink corners).

Targeted Costs

The targeted cost of the module depends primarily on the number of lenses comprised in the module. The present invention allows reducing the aberration by balancing the convergences of the lenses, rather than by adding more lenses.

More details on the EFL, C, BFL, FOV, MTF and F# can be found in the academic literature, for example "Modern Optical Engineering" by Warren J Smith, McGraw Hill.

With so many constraints, one can understand that a lens module is designed for a p articular set of specifications. However, as very often for a given sensor the phone makers develop several models with slightly different characteristics (slight variations on EFL, FOV, and MTF specifications). It is possible to design a module with some versatility by giving a range of variation to the various design parameters.

There exist a number of publications that describe modules composed of four lenses, or four groups of lenses, with restrictive conditions on the type of lens being used, the focal lengths of the lenses, or on the asphericity coefficients of the surfaces, which are tailored for particular applications and that differ from the present invention; for example: JP4479715; JP2003098428; JP2007108770; US5367405; JP7098430; JP1 1190820

SUMMARY OF THE INVENTION

The present invention relates to an optical module having an object side and an image side; the module comprising, from the object side to the image side:

a first positive meniscus lens having a convergence CI, made of a material having a refractive index Nd1 and an Abbe number Vd1, and comprising first and second optical surfaces, the first optical surface being convex and facing the object side, a second negative meniscus lens having a convergence C2 made of a material having a refractive index Nd2 and an Abbe number Vd2, and comprising third and fourth optical surfaces, a third positive meniscus lens, having a convergence C3, made of a material having a refractive index Nd3 and an Abbe number Vd3, and comprising fifth and sixth optical surfaces, the fifth optical surface being concave and facing the object side, and the sixth optical surface being convex and facing the image side, a fourth negative lens having a convergence C4, made of a material having a refractive index Nd4 and an Abbe number Vd4, and comprising seventh and eight optical surfaces, the seventh optical surface facing the object side, wherein:

$1.1 < C1/C < 1.35$ $\| C1/C2 \| \geq 2$ $0.5 < C1/C3 < 1.1$ $C1/Vd1 \leq 5.2$ $\| C2/Vd2 \| \leq 7$ $\| \Sigma(Ci/Vdi) \| \leq 4$ with i=1 to 4.

According to an embodiment of the invention, the module has a MTF at center (0% degree hFOV) larger than or equal to 75% at a spatial frequency of 89 lppm, for a monochromatic light with a wavelength of 0.555 microns According to an embodiment of the invention, the module has a relative difference between Sagital and Tangential MTF less than 8% at 50% hFOV; and less than 15% at 90% hFOV, at a spatial frequency of 89 lppm, for a monochromatic light with a wavelength of 0.555 microns.

According to an embodiment of the invention, the module has a Sagital MTF at 50% larger than or equal to 70% and a Tangential MTF at 50% larger than or equal to 65%, at a spatial frequency of 89 lppm, for a monochromatic light with a wavelength of 0.555 microns According to an embodiment of the invention, the module has a Sagital MTF at 90% larger than or equal to 58% and a Tangential MTF at 90% larger than or equal to 51%, at a spatial frequency of 89 lppm, for a monochromatic light with a wavelength of 0.555 microns According to an embodiment of the invention, the module comprises an aperture diaphragm between the first and second lenses; or an aperture diaphragm between the object side and the first lens.

According to an embodiment of the invention, the first lens is made of glass and the others three lenses are made of plastic.

According to an embodiment of the invention, the first and second lenses are made of glass, and the others two lenses are made of plastic.

According to an embodiment of the invention, the first and third lenses are made of glass, and the others two lenses are made of plastic.

According to an embodiment of the invention, the module has an EFL shorter than 4.4 mm, for a monochromatic light with a wavelength of 0.555 microns According to an embodiment of the invention, the module has an EFL shorter than 3.6 mm, for a monochromatic light with a wavelength of 0.555 microns According to an embodiment of the invention, the module further comprises an infrared filter and/or a light sensor after the fourth lens on the image side.

According to an embodiment of the invention, the module has a FOV comprised between 63 and 75 degrees.

According to an embodiment of the invention, the module operates with a light sensor arranged after the forth lens on the image side; the sensor comprising at least 5,000,000 pixels with pixels smaller or equal than 1.4 micron times 1.4 micron, arranged in a rectangular array where the dimension of the larger side to the smaller side are in a ratio of approximately 4/3

According to an embodiment of the invention, the sensor comprises at least 7,900,000 pixels, with pixels smaller or equal than 1.4 micron times 1.4 micron, arranged in a rectangular array where the dimension of the larger side to the smaller side are in a ratio of approximately 4/3.

DETAILED DESCRIPTION OF THE INVENTION

Figure 1:
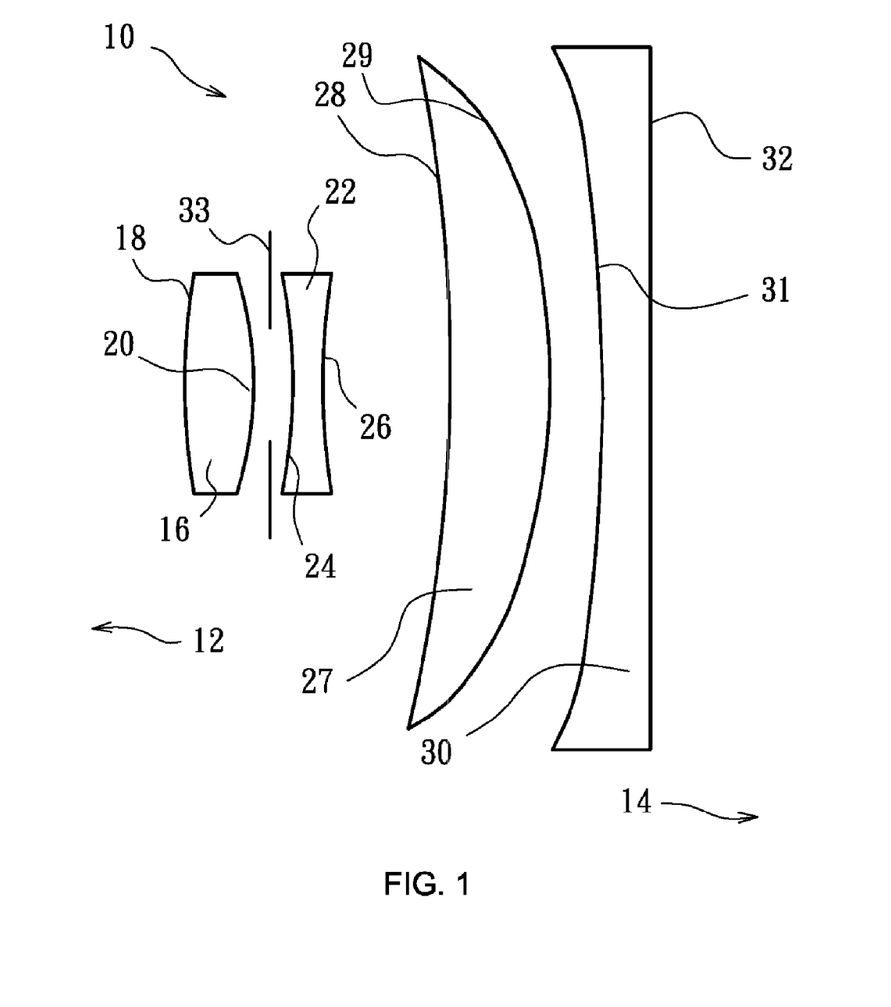
FIG. 1 illustrates a four-lens optical module according to an embodiment of the present invention.

FIG. 1 illustrates a four-lens optical module 10 according to an embodiment of the present invention.

Optical module 10 has an object side 12 and an image side 14; the module comprising, from the object side 12 to the image side 14: a first, positive, lens 16 having a focal length F1 and comprising first 18 and second 20 optical surfaces. The first optical surface 18 being convex and facing the object side 12.

Optical module 10 then comprises a second, negative, lens 22 having a focal length F2 and comprising third 24 and fourth 26 optical surfaces, the third optical surface 24 facing the object side 12.

Optical module 10 then comprises a third, positive, lens 27 having a focal length F3 and comprising fifth 28 and sixth 29 optical surfaces, the fifth optical surface 28 facing the object side 12, and being concave, and the sixth optical surface 29 facing the image side 14 and being convex.

Optical module 10 then comprises a fourth, negative, lens 30 having a focal length F4 and comprising seventh 31 and eighth 32 optical surfaces, the seventh optical surface 31 facing the object side 12.

Preferably, optical module 10 comprises a stop 33 situated either between the two lenses 16, 22, or in front of the first lens 16. Preferably, the lens 16 is made out of glass.

Preferably, the two optical surfaces of each of the four lenses are aspherical, and the lenses are made by molding.

According to the present invention, the global optical power of the module is spread between the four optical surfaces, the positive lenses having a positive contribution to the total power, and the negative lenses having a negative contribution to it.

According to the present invention, the power of the first lens has to be comprised between 1.1 times and 1.35 times the total power of the whole module, which can be expressed by the relation:

$$1.1 < C1/C < 1.35 \quad (1)$$

where CI is the convergence of the first lens and C the convergence of the whole module.

Further, according to the present invention, the ratio of the absolute values of the power of the first lens to the power of the second lens has to be larger than, or equal to, 2, which can be expressed by the relation:

$$\text{II } C1/C2 \text{ II} \geq 2 \quad (2)$$

where "II x II" means "absolute value of x".

Further, according to the present invention, the ratio of the power of the first lens CI to the power of the third lens C3 must be within 0.5 and 1.1.

$$0.5 < C1/C3 < 1.1 \quad (3)$$

The high power concentrated in the first lens 16, and in the third lens 27 may introduce a large chromatic dispersion if additional conditions are not imposed.

As the EFL of a lens depends on the refractive index, the chromatic dispersion Af for a module having an EFL F is the difference of EFL at the extreme of the visible spectrum, for the Blue line fEFL(Nf) and Red line c of the hydrogen (EFL (Nc)):

$$\Delta f = EFL(Nc) - EFL(Nf)$$

According to the academic literature, when one considers a combination of two lenses A and B of convergence Ca and Cb, made of a material such as glass, with respective refractive indexes Nda and Ndb, with respective Abbe numbers Vda, Vdb and composing a two lenses module having a convergence C, the minimization of the chromatic dispersion requires that the following condition be satisfied:

$$(Ca/Vda + Cb/Vdb) \text{ is as close as possible to zero } (\sim 0)$$

where Vdi represents for a ith lens the Abbe number corresponding to the wave length of the yellow sodium line, in the middle of the visible spectrum (wave length λ=587.56 nm).

Extended to a multiple-lens module, the relation becomes:

$$\Sigma(Ci/Vdi) \sim 0 \quad (4)$$

Where Ci and Vdi are the respective convergence and Abbe number of the ith lens.

This relation imposes that the module must be composed of lenses having negative and positive convergences, and made of material chosen with Abbe numbers allowing the condition (4) to be satisfied.

The present invention comprises alternatively positive and negative lenses. Further, according to the present invention the lenses are chosen such that they comply with the following relations (where C is expressed in Dioptries)

$$C1/Vd1 \leq 5.2 \quad (5)$$

$$\text{II } C2/Vd2 \text{ II} \leq 7 \quad (6)$$

$$\text{II } \Sigma(Ci/Vdi) \text{II} \leq 4 \quad (7)$$

where i=1, 2, 3, 4; and where Ci represents the convergence of the ith lens, Vdi represents the Abbe number of the ith lens for the wave length of the yellow sodium above, defined as Vdi=(Ndi−1)/(Nfi−Nci), where Nfi and Nci are for the ith lens the refractive indexes corresponding respectively to the wave lengths of the Blue Hydrogen line and the Red Hydrogen line, and Ndi the refractive index of the ith lens for the yellow sodium line, in the middle of the visible spectrum.

The inventors have noted that given that the first lens 16 has a relatively high power CI, above 250 Dioptries, the relation (5) is more easily met when Vd1>65.

The inventors have noted that a module according to the present invention, having four lenses complying with relations (1-3) and (5-7) above, allows a remarkable reduction of the astigmatism of the module, thus allowing to reach high performances. For example, the Inventors have noted that a four-lens module according to the present invention, will have a module MTF at center (0% degree hFOV) larger than or equal to 75% at a spatial frequency of 89 lppm for a monochromatic light of 0.555 microns.

As outlined hereafter in relation with embodiments of the invention, a module according to the present invention further has, for a monochromatic light of 0.555 microns, a relative difference between Sagital and Tangential MTF less than 8% at 50% hFOV; and less than 15% at 90% hFOV, at a spatial frequency of 89 lppm.

Preferably, a module according to the present invention has, for a monochromatic light of 0.555 microns, a Sagital MTF, at 50% hFOV larger than or equal to 70% and a Tangential MTF at 50% hFOV larger than or equal to 65%, at a spatial frequency of 89 lppm.

Preferably, a module according to the present invention has, for a monochromatic light of 0.555 microns, a Sagital MTF at 90% hFOV larger than or equal to 58% and a Tangential MTF at 90% hFOV larger than or equal to 51%, at a spatial frequency of 89 lppm.

Preferably, a module according to the present invention has a FOV comprised between 63 and 75 degrees. The inventors have noted that a module according to the present invention, comprising four lenses and having a good balance between the Sagital and Tangential components of the MTF all over the field of view, and having a FOV, expressed in degrees, comprised between 63 and 75 degrees, is capable of giving an image with a resolution comprised between 5 megapixels and larger or equal to 8 megapixels, with a ratio of the sensor diagonal to the focal length comprised between 1.27 and 1.55 and a F# smaller than 2.5.

Embodiments of the invention will now be described in detail.

First Embodiment: Module Having an EFL=4.22 mm (C=237)

Figure 2:
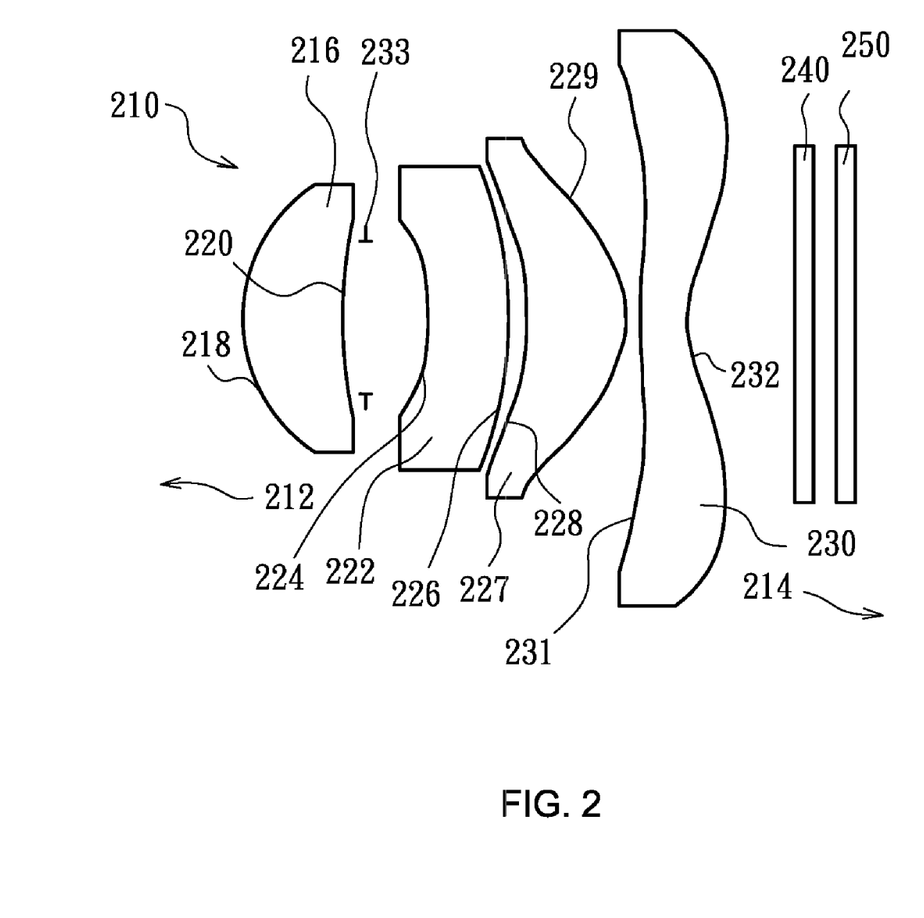
FIG. 2 illustrates a module according to another embodiment of the present invention.

FIG. 2 illustrates a lens optical module 210 according to an embodiment of the present invention.

Optical module 210 has an object side 212 and an image side 214; the module comprising, from the object side 212 to the image side 214: a first, positive, lens 216 having a focal length F1 and comprising first 218 and second 220 optical surfaces. The first optical surface 218 being convex and facing the object side 212.

Optical module 210 then comprises a second, negative, lens 222 having a focal length F2 and comprising third 224 and fourth 226 optical surfaces, the third optical surface 224 facing the object side 212.

Optical module 210 then comprises a third, positive, lens 227 having a focal length F3 and comprising fifth 228 and sixth 229 optical surfaces, the fifth optical surface 228 facing the object side 212, and being concave, and the sixth optical surface 229 facing the image side 214 and being convex.

Optical module 210 then comprises a fourth, negative, lens 230 having a focal length F4 and comprising seventh 231 and eighth 232 optical surfaces, the seventh optical surface 231 facing the object side 212.

Optical module 210 comprises a stop/aperture diaphragm 233 situated between the two lenses 216, 222.

Optionally, the module 210 further comprises an infrared filter 240 after the fourth lens 232 on the image side.

Optionally, the module 210 further comprises a light sensor 250 after the fourth lens 232 (and eventually after the infrared filter 240) on the image side. Alternatively, module 210 is capable of operating with light sensor 250 but light sensor 250 does not form part of the module.

According to an embodiment of the invention, light sensor 250 comprises at least 7,900,000 pixels with pixels smaller or equal than 1.4 micron times 1.4 micron, arranged in a rectangular array where the dimension of the larger side to the smaller side are in a ratio of approximately 4/3.

According to another embodiment of the invention, light sensor 250 comprises at least 5,000,000 pixels with pixels smaller or equal than 1.4 micron times 1.4 micron, arranged in a rectangular array where the dimension of the larger side to the smaller side are in a ratio of approximately 4/3.

The F# of module 210 is 2.5.

The full FOV, expressed as an angle is 67 degrees.

The materials used for the lenses have the following characteristics:

|  | Nd | Vd |
|---|---|---|
| 1st lens 216 | 1.48 | 84.2 |
| 2nd lens 222 | 1.63 | 23.4 |
| 3rd lens 227 | 1.53 | 56.1 |
| 4th lens 230 | 1.53 | 56.1 |

The module illustrated in FIG. 2 has the following characteristics:

| C1 | C2 | C3 | C4 | C = 1/F | C1/C | C1/Vd1 | C2/Vd2 | C1/C2 | C1/C3 | ΣC/Vd |
|---|---|---|---|---|---|---|---|---|---|---|
| 271 | −127 | 512 | −475 | 237 | 1.143 | 3.219 | −5.427 | −2.134 | 0.529 | −1.549 |

Module 210 complies with the conditions (1), (2), (3), (5), (6), (7)

Figure 3:
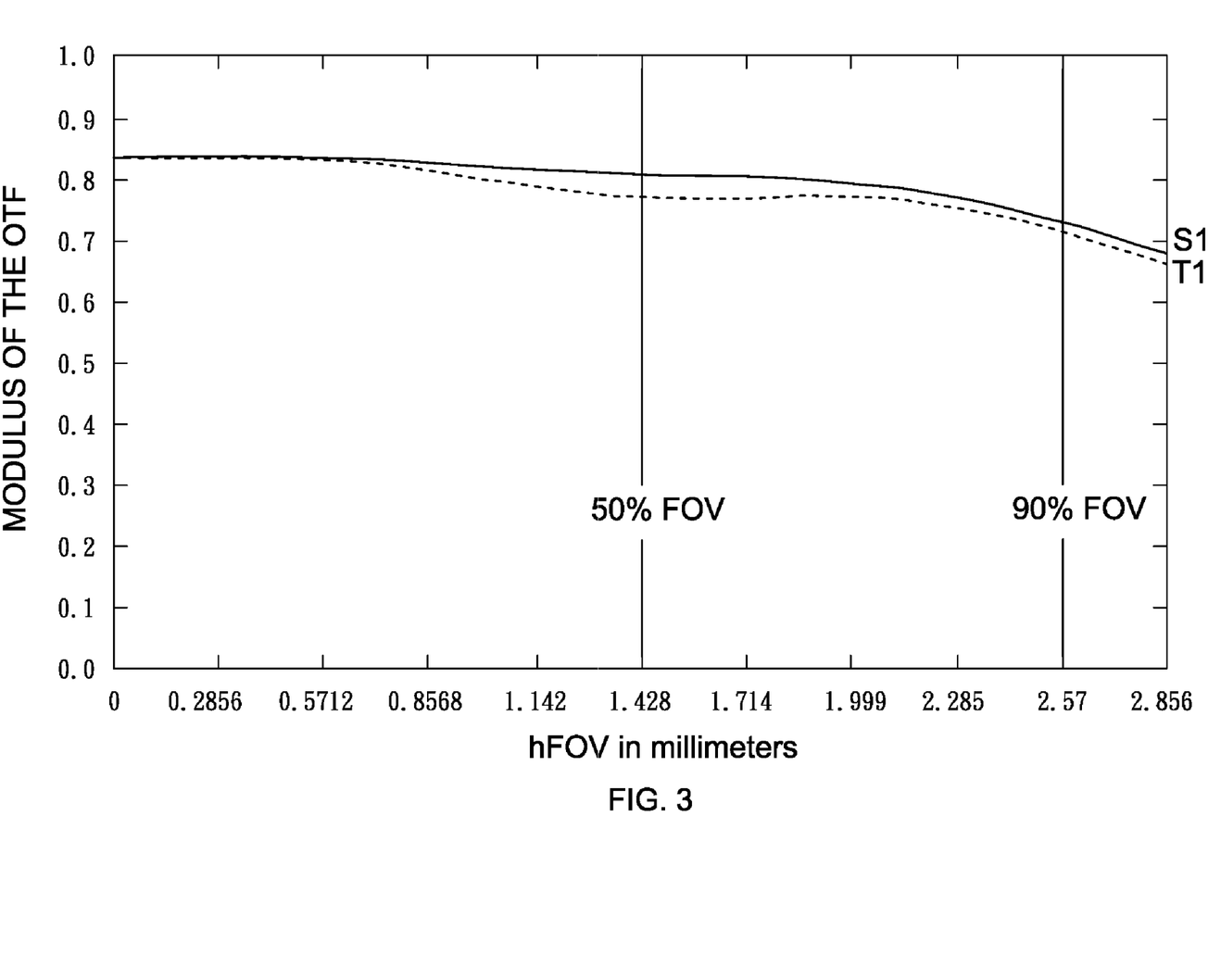
FIG. 3 illustrates the performances in MTF at a spatial frequency of 89 lppm of the module of FIG. 2.

The performances in MTF versus hFOV of module 210 are illustrated in FIG. 3, which illustrates the variation of the Optical Transfer Function: Sagital MTF (Reference SI) and Tangential MTF (Reference T1) in percentage (from 0%—0.0 to 100%—1.0) with respect to the position in the half field of vision hFOV (in millimeters); at 89 lppmm and for a monochromatic light of 0.555 microns.

The performances are characterized by:

MTF at center: 83%

MTF at 50% hFOV: Sagital MTF=80%; Tangential MTF=77%

MTF at 90% hFOV: Sagital MTF=71%; Tangential MTF=69%

The relative difference between the Sagital and Tangential MTF is less than 4% at 50% hFOV, and less than 8% at 90% hFOV.

In the illustrated embodiment, the full hFOV corresponds to an image height of 2.856 mm.

Second Embodiment: Module Having an EFL=3.314 mm (C=302)

Figure 4:
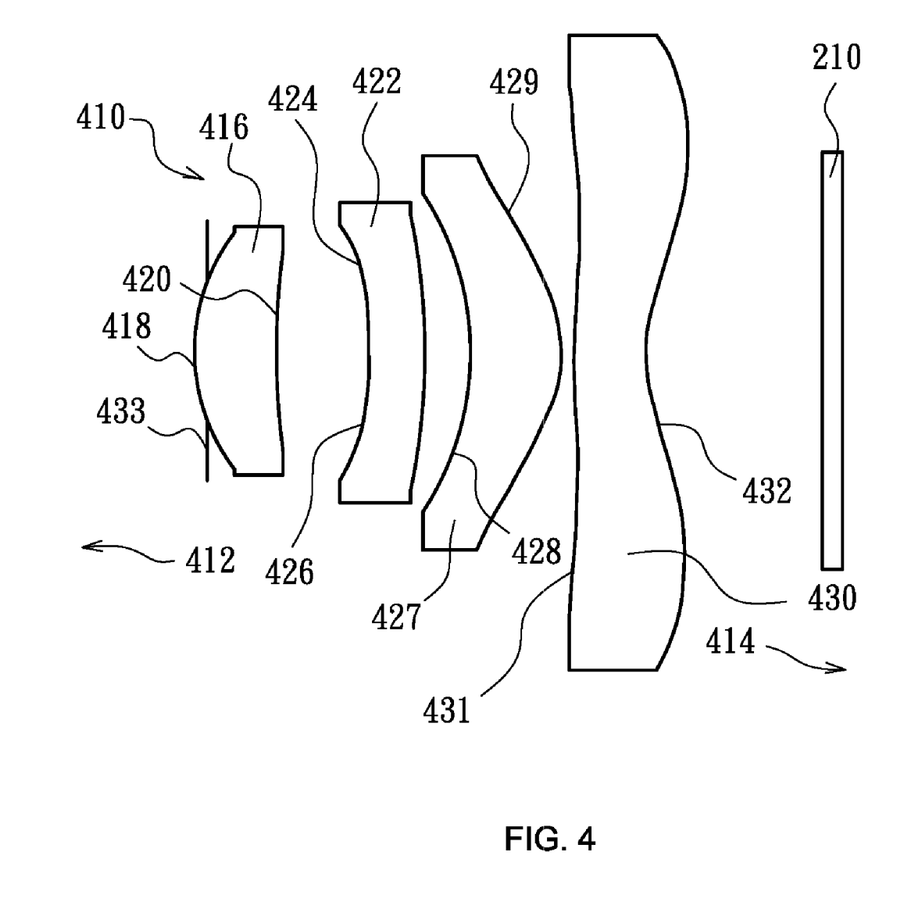
FIG. 4 illustrates a module according to another embodiment of the present invention.

FIG. 4 illustrates a lens optical module 410 according to an embodiment of the present invention.

Optical module 410 has an object side 412 and an image side 414; the module comprising, from the object side 412 to the image side 414: a first, positive, lens 416 having a focal length F1 and comprising first 418 and second 420 optical surfaces. The first optical surface 418 being convex and facing the object side 412.

Optical module 410 then comprises a second, negative, lens 422 having a focal length F2 and comprising third 424 and fourth 426 optical surfaces, the third optical surface 424 facing the object side 412.

Optical module 410 then comprises a third, positive, lens 427 having a focal length F3 and comprising fifth 428 and sixth 429 optical surfaces, the fifth optical surface 428 facing the object side 412, and being concave, and the sixth optical surface 429 facing the image side 414 and being convex.

Optical module 410 then comprises a fourth, negative, lens 430 having a focal length F4 and comprising seventh 431 and eighth 432 optical surfaces, the seventh optical surface 431 facing the object side 412.

Optical module 410 comprises a stop/aperture diaphragm 433 situated at the contact with the first surface, facing the object side, of the first lens 416.

Optical module 410 can comprise an infrared filter as optical module 210, and can comprise, or be provided for operating with, a light sensor as optical module 210.

Optical module 410 is well adapted to operate with a light sensor 450 comprising around 5 million pixels of 1.4×1.4 microns, arranged in a rectangular array, the larger side of the array being in a proportion of 4/3 with the other side.

The F# of optical module 410 is 2.4.

The full FOV, expressed as an angle, is 67.4 degrees

The materials used for the lenses have the following characteristics:

|  | Nd | Vd |
|---|---|---|
| 1st lens 416 | 1.48 | 84.2 |
| 2nd lens 422 | 1.63 | 23.4 |
| 3rd lens 427 | 1.53 | 56.1 |
| 4th lens 430 | 1.53 | 56.1 |

This module presents the following characteristics:

| C1 | C2 | C3 | C4 | C = 1/F | C1/C | C1/Vd1 | C2/Vd2 | C1/C2 | C1/C3 | ΣC/Vd |
|---|---|---|---|---|---|---|---|---|---|---|
| 337 | −109 | 501 | −523 | 302 | 1.116 | 3.998 | −4.658 | −3.092 | 0.672 | 1.06 |

This module complies with the conditions (1), (2), (3), (5), (6), (7)

Figure 5:
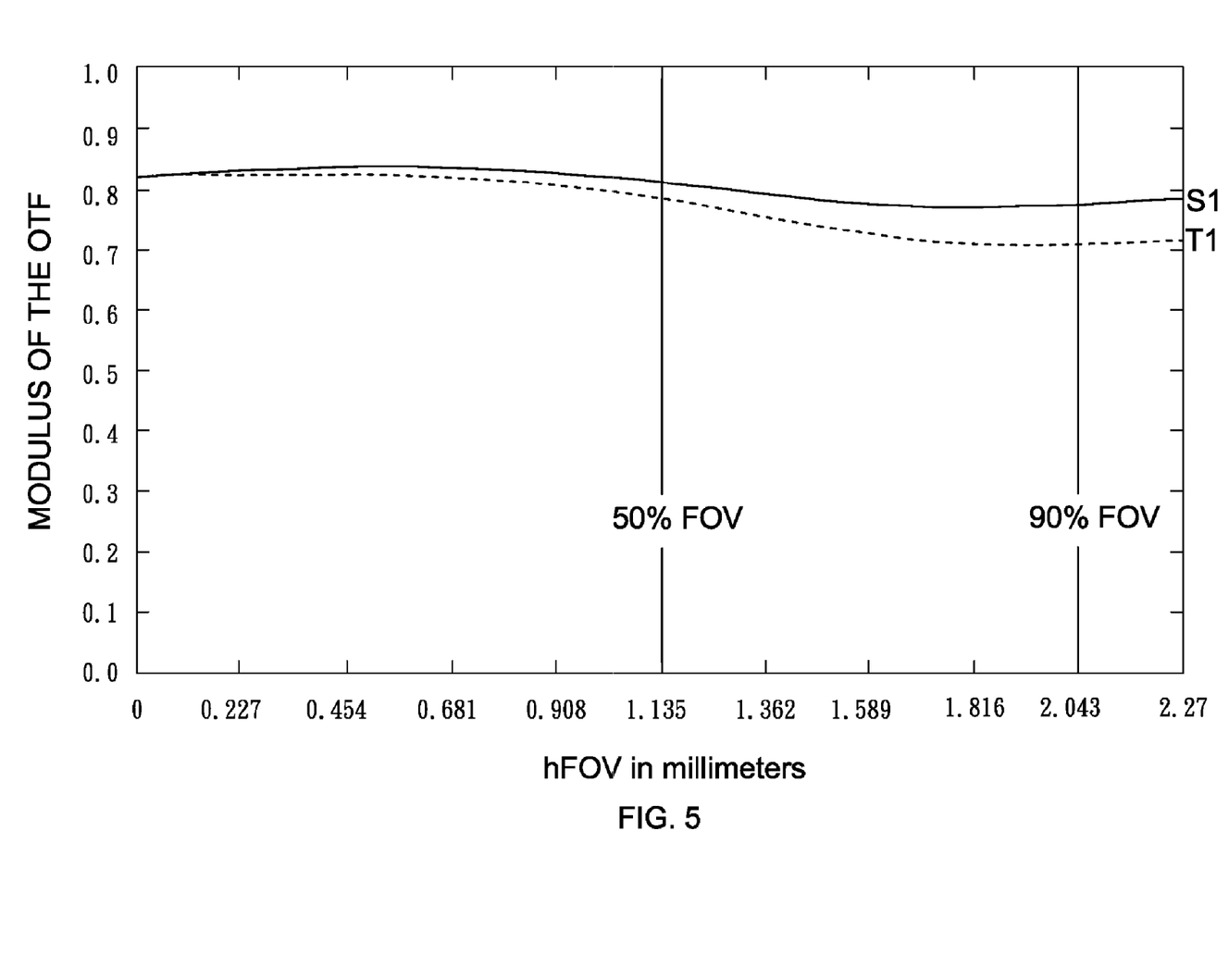
FIG. 5 illustrates the performances in MTF at a spatial frequency of 89 lppm of the module of FIG. 4.

The performances in MTF versus hFOV of module 410 are illustrated in FIG. 5, which illustrates the variation of the Optical Transfer Function: Sagital MTF (Reference SI) and Tangential MTF (Reference T1) in percentage (from 0%—0.0 to 100%—1.0) with respect to the position in the half field of vision hFOV (in millimeters); at 89 lppmm, and for a light with a wavelength of 0.555 microns.

The performances are characterized by:

MTF at center: 81.8%

MTF at 50% hFOV: Sagital MTF=80%; Tangential MTF=78%

MTF at 90% hFOV: Sagital MTF=77%; Tangential MTF=70%

The relative difference between Sagital and Tangential MTF is less than 4% at 50% hFOV, and less than 8% at 90% hFOV.

The full hFOV corresponds to an image height of 2.27 mm

The above embodiments have been described for illustrative purpose only, and shall not be used to limit the present invention. The invention is defined by the enclosed claims.

The invention claimed is:

1. An optical module having an object side and an image side; the module comprising, from the object side to the image side:
   a first positive meniscus lens having a convergence C1, made of a material having a refractive index Nd1 and an Abbe number Vd1, and comprising first and second optical surfaces, the first optical surface being convex and facing the object side,
   a second negative meniscus lens having a convergence C2 made of a material having a refractive index Nd2 and an Abbe number Vd2, and comprising third and forth optical surfaces,
   a third positive meniscus lens, having a convergence C3, made of a material having a refractive index Nd3 and an Abbe number Vd3, and comprising fifth and sixth optical surfaces, the fifth optical surface being concave and facing the object side, and the sixth optical surface being convex and facing the image side,
   a fourth negative lens having a convergence C4, made of a material having a refractive index Nd4 and an Abbe number Vd4, and comprising seventh and eight optical surfaces, the seventh optical surface facing the object side,
   wherein:

$1.1 < C1/C < 1.35$ $\| C1/C2 \| \geq 2$ $0.5 < C1/C3 < 1.1$ $C1/Vd1 \leq 5.2$ $\| C2/Vd2 \| \leq 7$ $\| \Sigma(Ci/Vdi) \| \leq 4$ with i=1 to 4.

2. The module of claim 1, having a MTF at center (0% degree hFOV) larger than or equal to 75% at a spatial frequency of 89 lppm, for a monochromatic light with a wavelength of 0.555 microns.

3. The module of claim 1, having a relative difference between Sagital and Tangential MTF less than 8% at 50% hFOV; and less than 15% at 90% hFOV, at a spatial frequency of 89 lppm, for a monochromatic light with a wavelength of 0.555 microns.

4. The module of claim 1, having a Sagital MTF at 50% larger than or equal to 70% and a Tangential MTF at 50% larger than or equal to 65%, at a spatial frequency of 89 lppm, for a monochromatic light with a wavelength of 0.555 microns.

5. The module of claim 1, having a Sagital MTF at 90% larger than or equal to 58% and a Tangential MTF at 90% larger than or equal to 51%, at a spatial frequency of 89 lppm, for a monochromatic light with a wavelength of 0.555 microns.

6. The module of claim 1, having an aperture diaphragm between the first and second lenses; or an aperture diaphragm between the object side and the first lens.

7. The module of claim 1, wherein the first lens is made of glass and the others three lenses are made of plastic.

8. The module of claim 1, wherein the first and second lenses are made of glass, and the others two lenses are made of plastic.

9. The module of claim 1, wherein the first and third lenses are made of glass, and the others two lenses are made of plastic.

10. The module of claim 1 wherein the module has an EFL shorter than 4.4 mm, for a monochromatic light with a wavelength of 0.555 microns.

11. The module of claim 10, wherein the module has an EFL shorter than 3.6 mm, for a monochromatic light with a wavelength of 0.555 microns.

12. The module of claim 1, further comprising an infrared filter and/or a light sensor after the fourth lens on the image side.

13. The module of claim 1, having a FOV comprised between 63 and 75 degrees.

14. The module of claim 1, operating with a light sensor arranged after the forth lens on the image side; the sensor comprising at least 5,000,000 pixels with pixels smaller or equal than 1.4 micron times 1.4 micron, arranged in a rectangular array where the dimension of the larger side to the smaller side are in a ratio of approximately 4/3.

15. The module of claim 14, wherein the sensor comprises at least 7,900,000 pixels, with pixels smaller or equal than 1.4 micron times 1.4 micron, arranged in a rectangular array where the dimension of the larger side to the smaller side are in a ratio of approximately 4/3.

* * * * *